United States Patent [19]

Wissell

[11] Patent Number: 4,859,952
[45] Date of Patent: Aug. 22, 1989

[54] APPARATUS AND METHOD FOR TESTING IMPEDANCES OF INTERCONNECT DEVICES

[75] Inventor: Daniel Wissell, Westford, Mass.

[73] Assignee: Digital Equipment Corp., Maynard, Mass.

[21] Appl. No.: 137,928

[22] Filed: Dec. 28, 1987

[51] Int. Cl.⁴ .............................................. G01R 31/04
[52] U.S. Cl. .................................... 324/538; 324/526; 324/62
[58] Field of Search ................. 324/538, 525, 526, 62, 324/57 R, 421

[56] References Cited

U.S. PATENT DOCUMENTS

| | | | |
|---|---|---|---|
| 3,636,439 | 1/1972 | Colligan | 324/57 R |
| 3,821,642 | 6/1974 | Seymore | 324/DIG. 1 X |
| 3,928,795 | 12/1975 | Lechner | 324/421 |
| 3,984,768 | 10/1976 | Staples | 324/62 |
| 4,498,044 | 2/1985 | Horn | 324/57 R X |
| 4,654,580 | 3/1987 | Keller | 324/61 R X |

FOREIGN PATENT DOCUMENTS 2432323  1/1975  Fed. Rep. of Germany ...... 324/421

Primary Examiner—Reinhard J. Eisenzopf
Assistant Examiner—Robert W. Mueller
Attorney, Agent, or Firm—William W. Holloway; William C. Cray

[57] ABSTRACT

In electronic devices, such as data processing systems that operate at high frequencies, the integrity of the interconnect or coupling apparatus transferring signals between component modules is critical to prevent compromise of information being transferred. However, the interconnect or coupling apparatus is subject to both long term and to short term impedance variations. Apparatus is disclosed for testing both the long term impedance changes and the rapid fluctuations that are not observable by current testing procedures. In addition, apparatus is disclosed for providing controllable rapid impedance changes to verify the operation of test apparatus, disclosed herein, for measuring the rapid impedance changes.

23 Claims, 5 Drawing Sheets

APPARATUS AND METHOD FOR TESTING IMPEDANCES OF INTERCONNECT DEVICES

RELATED APPLICATION

The following U.S. Patent Application is related to the present invention.

"APPARATUS AND METHOD FOR TESTING CONTACT INTERRUPTIONS OF CIRCUIT INTERCONNECTION DEVICES", invented by Daniel Wissell; having Ser. No. 013,323; filed Feb. 11, 1987, now U.S. Pat. No. 4,751,721 issued June 14, 1988 and assigned to the assignee of the present U.S. Patent Application.

BACKGROUND

1. Field of the Invention

This invention relates generally to the testing of electronic apparatus and more particularly to the testing of the impedances of the interconnect devices by which signals are transferred between electrically coupled system components.

2. Description of the Related Art

As the performance has been improved for data processing systems, the interconnection between the modules, boards, etc of the data processing system has become more critical. The frequencies of the signals in a presently available high performance data processing system are such that the distributed parameters of the connecting cables can be important, requiring that the connecting cables be terminated with the characteristic impedance of the cable (i.e., to minimize signal reflections, etc.). When the properties change for the interconnect apparatus carrying the signals being transferred, either as a result of long term parameter changes or as a result of (relatively rapid) mechanical conditions, the transmission of signals through the interconnect device can be compromised because of a change in the impedance.

In the related art, the testing of the interconnect device has been typically performed with apparatus functioning as an ohmmeter. The only parameter considered important has been the continuity of the electrical connection. However, as described above, the actual value of the impedance of the contact has become important for system operation. In addition, momentary changes in the impedance, which can be produced as a result of mechanical vibration, of the interconnect device can provide an impact on the performance of the data processing system. For testing purposes, the interconnect device can be activated mechanically and intermittent changes in continuity across the interconnect device can be tested. However, the intermittent changes, because of their transient nature, have been difficult to detect and even more difficult to quantify. As will be clear to those skilled in the art, attempts to identify intermittent errors are extremely difficult. An additional problem in the determination of intermittent impedance changes is the verification of the test apparatus used in measuring these changes.

A need has therefore been felt for apparatus and a method that can identify long term and short variations in impedance of interconnect devices transferring signals between system modules.

FEATURES OF THE INVENTION

It is an object of the present invention to provide an improved technique for testing data processing systems.

It is a feature of the present invention to provide an improved technique for testing interconnect devices electrically coupling modules, boards, etc of data processing systems.

It is another feature of the present invention to detect rapid changes in the impedance of interconnect device.

It is yet another feature of the present invention to provide a signal indicating the presence of an intermittent impedance change and signals permitting measurement of the duration of the intermittent impedance changes of an interconnect device.

It is still another feature of the present invention to provide apparatus for providing rapid changes in impedance to verify the operation of apparatus testing rapid changes in interconnect devices.

It is a further feature of the present invention to provide apparatus for measuring the magnitude of relatively slow changes in the impedance of an interconnect device.

SUMMARY OF THE INVENTION

The aforementioned and other features are accomplished, according to the present invention, by coupling the interconnect device, terminated with the characteristic impedance, as one portion of a balanced bridge circuit. When the impedance of the interconnect device changes, the bridge circuit will no longer be balanced, causing a imbalance signal to be generated. The imbalance signal, when resulting from relatively slow changes in the impedance of the interconnect device, is processed to provide a system output signal that is proportional to the change in impedance. For intermittent changes, such as can result from mechanical vibration of the interconnect device, the disclosed apparatus measures the occurrence of an intermittent impedance change and provides a clock signal by which the duration of the intermittent impedance change can be determined. In addition, apparatus is disclosed by which the operation of the apparatus measuring intermittent changes can be verified.

These and others features of the invention will be understood upon reading of the following description along with the drawings.

DESCRIPTION OF THE PREFERRED EMBODIMENT

1. Detailed Description of the Figures

Figure 1:
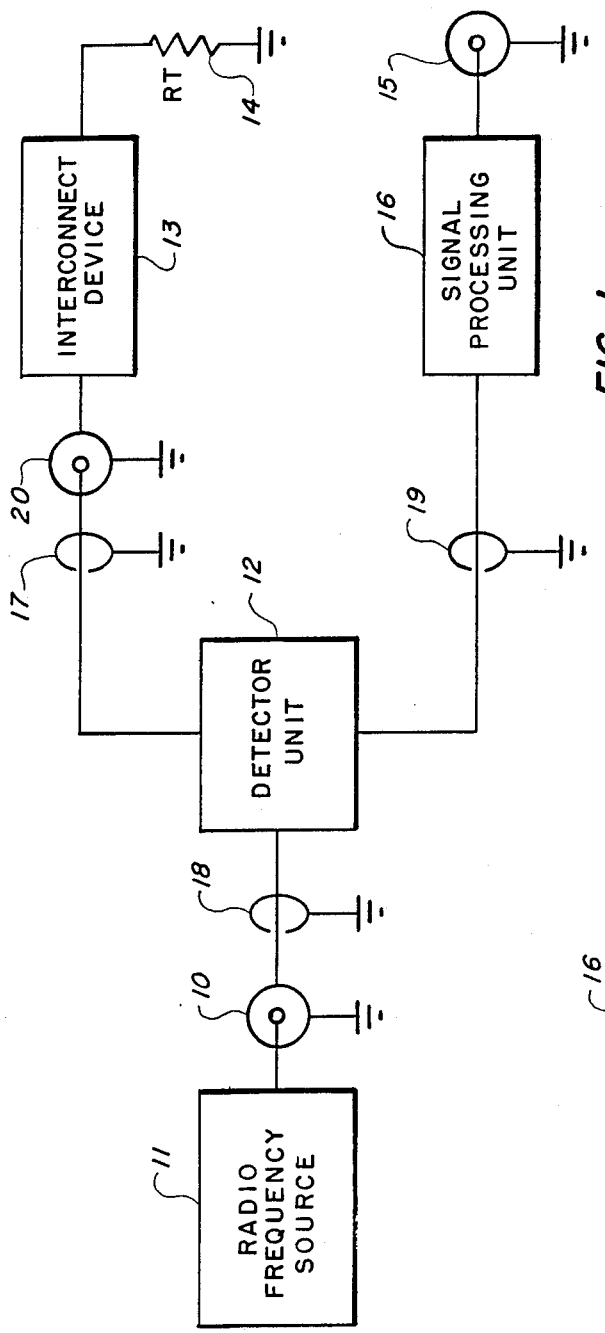
FIG. 1 is a block diagram of the apparatus for testing interconnect devices according to the present invention.

Referring now to FIG. 1, a block diagram of the apparatus for testing a controlled impedance interconnect device is shown. Radio frequency source 11 applies a radio frequency signal through input terminal 10 to detector unit 12. Detector unit 12 is coupled through terminal 20 to the controlled impedance interconnect device 13 and is coupled to signal processing unit 16. The output signal of signal processing unit 16 is coupled to output terminal 15. The controlled impedance interconnect unit 13 is coupled to resistor RT 14. The components of the testing apparatus are coupled by shielded cables 18, 17 and 19.

Figure 2:
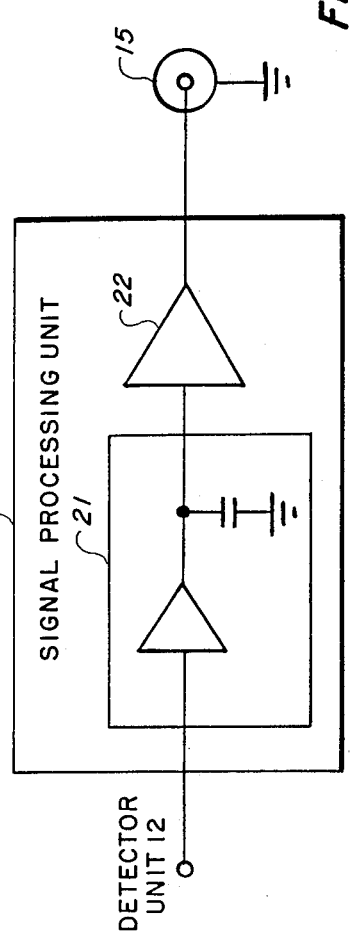
FIG. 2 is a block diagram of the signal processing unit for testing long term changes in the impedance of the interconnect device.

Referring next to FIG. 2, the functionality of the signal processing unit 16 for long term impedance changes is illustrated in a block diagram format. The signal from the detector unit 12 is applied to filter unit 21. The output signal from the filter unit 21 is applied to amplifier unit 22. The output signal from amplifier unit 22 is applied to output terminal 15.

Figure 3:
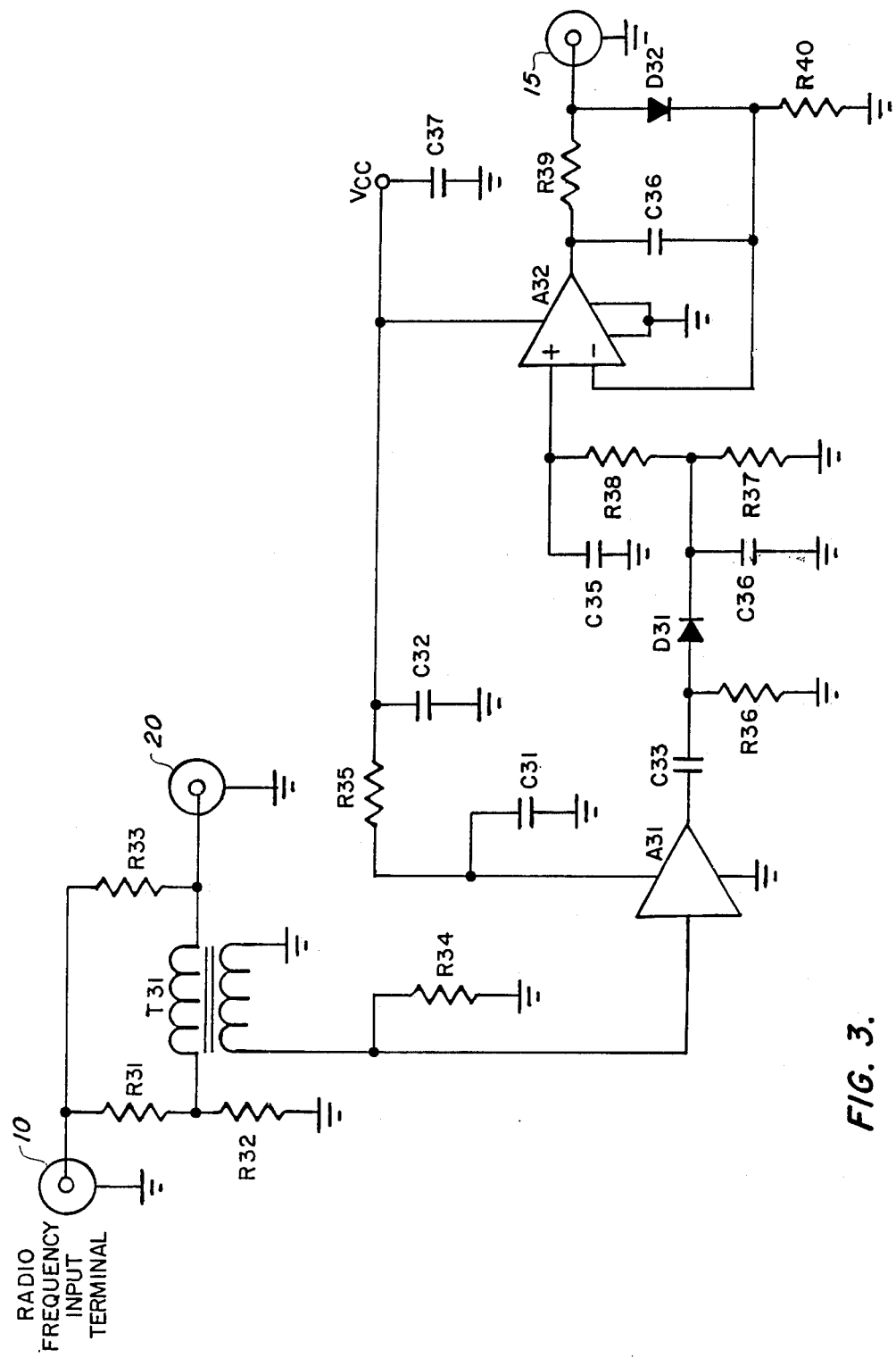
FIG. 3 is a schematic circuit diagram of the apparatus for testing long term changes in the impedance of an interconnect device.

Referring next to FIG. 3, the schematic circuit diagram of the detector unit 12 and the signal processing unit 16 for testing the long term stability of the controlled impedance interconnect device 13 is shown. Input terminal 10 is coupled to a first terminal of resistor R31 and to a first terminal of resistor R33. A second terminal of resistor R31 is coupled through resistor R32 to the common potential and to a first input terminal of transformer T31. A second terminal of resistor R33 is coupled to a second input terminal of transformer T31 and to Terminal 20. One output terminal of transformer T31 is coupled to a common potential, while a second terminal of transformer T31 is coupled through resistor R34 to the common potential and to an input terminal of amplifier A31. The power terminal of amplifier A31 is coupled through resistor R35 to the power source VCC and through capacitor C31 to the common potential. The power source $V_{CC}$ is coupled to the input power terminal of amplifier A32, through capacitor C32 to the common potential and though capacitor C37 to the common potential. The output terminal of amplifier A31 is coupled through capacitor C33 to a first terminal of resistor R36 and to an anode terminal of diode D31. A second terminal of resistor R36 is coupled to the common potential. A cathode terminal of diode D31 is coupled through capacitor C34 to the common potential, through resistor R37 to the common potential and to a first terminal of resistor R38. A second terminal of resistor R38 is coupled through capacitor C35 to the common potential and to a first input terminal of amplifier A32. The output terminal of amplifier A32 is coupled through capacitor C36 to a second input terminal of amplifier A32 and through resistor R39 to terminal 15. Terminal 15 is coupled to an anode terminal of diode D32, while a cathode terminal of diode D32 is coupled to the second input terminal of amplifier A32. The ground terminals of amplifiers A31 and A32 are coupled to the common potential. In the preferred embodiment, amplifier A31 is an NE5205 operational amplifier with a gain of 18 db. The amplifier A32 is a TL-251 CMOS operational amplifier. Diodes D31 and D32 are matched Hewlett-Packard Schottky barrier diodes, type 5082-2800. Resistors R31 and R32 are low wattage, non-inductive metal film elements. Resistor R36 is also a non-inductive type resistor.

Figure 4:
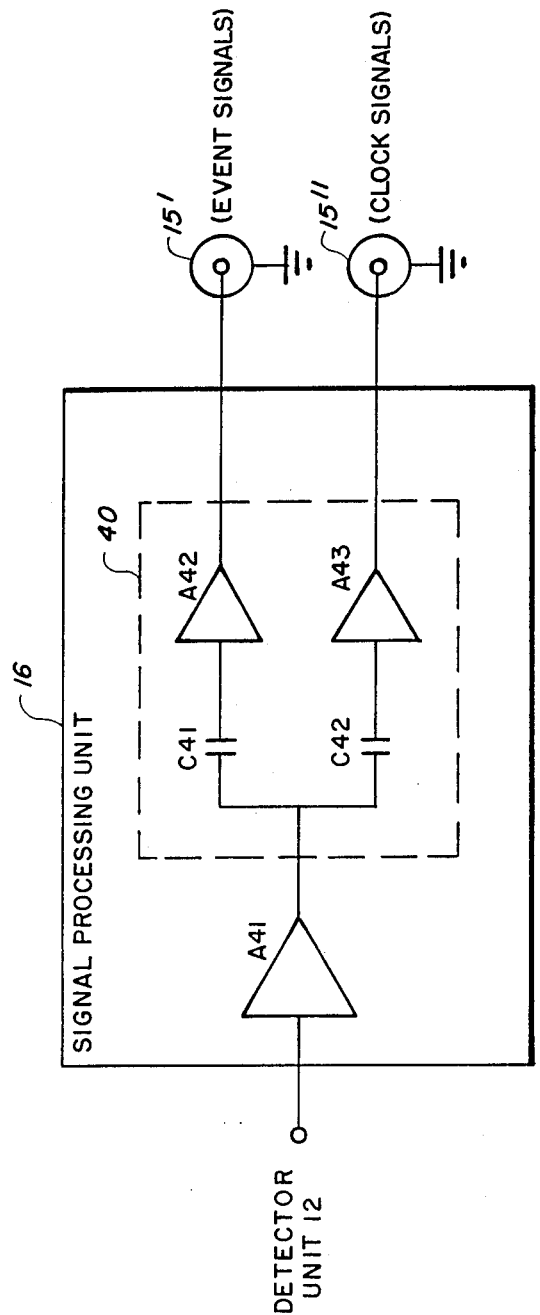
FIG. 4 is a block diagram of the signal processing unit for detection of intermittent changes in the impedance in a interconnect device.

Referring next to FIG. 4, the block diagram of the signal processing unit 16 for identifying transient changes in the controlled interconnect device under test is illustrated. A signal from detector unit 12 is amplified and applied to an input terminal of amplifier A41. The output signal of amplifier 41 is applied to a voltage comparator unit 40 which includes a capacitor C41 coupled in series with an amplifier A42, this combination of components being coupled in parallel with the series combination of capacitor C42 and amplifier A43. The output terminal of amplifier A42 is coupled to output terminal 15' while the output terminal of amplifier A43 is coupled to output terminal 15''.

Figure 5:
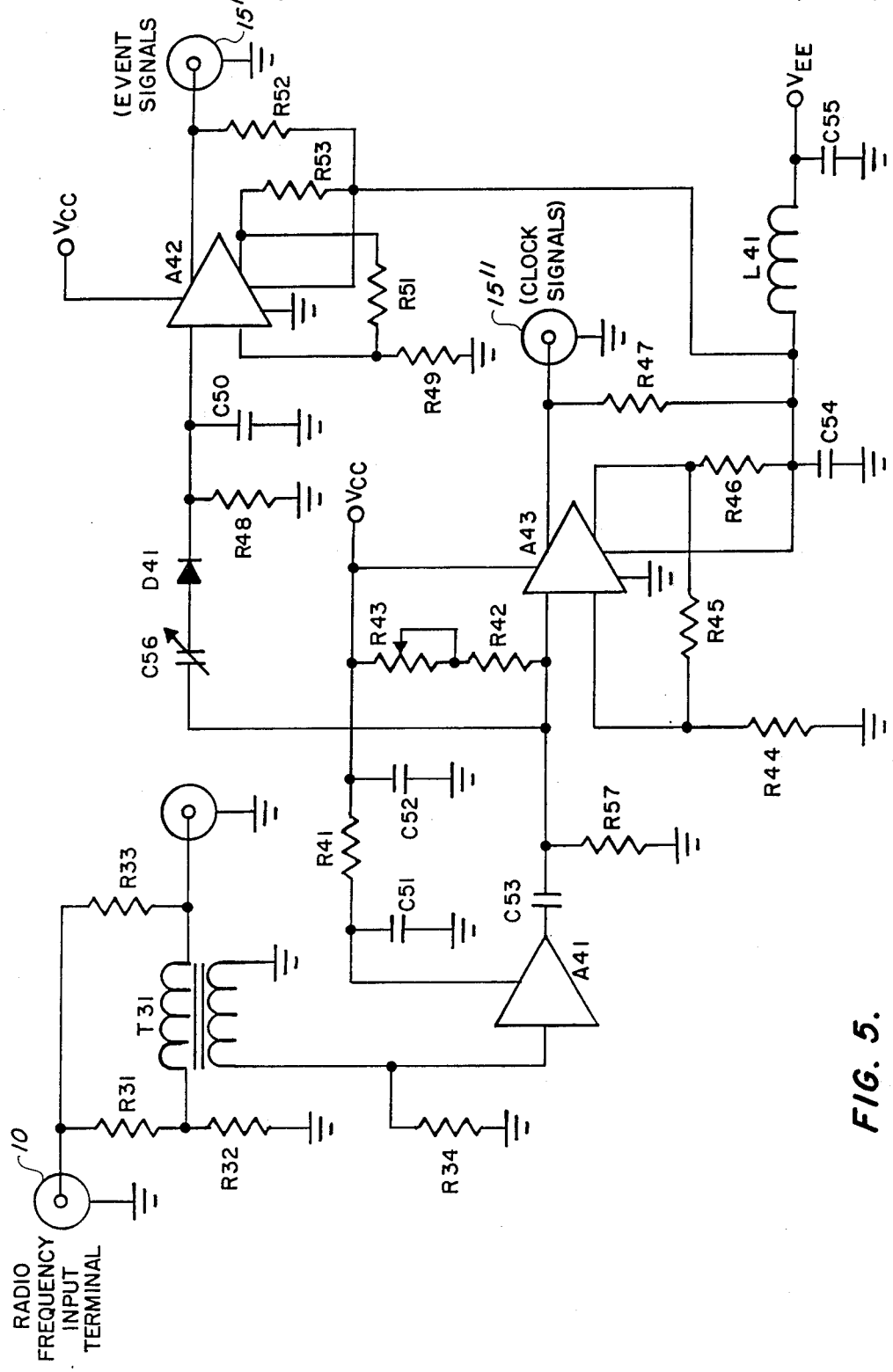
FIG. 5 is a schematic diagram of the detector unit and signal processing unit of the apparatus for detecting intermittent changes in the impedance of interconnect devices.

Referring next to FIG. 5, the apparatus for testing for short term transient and intermittent impedance changes in an impedance controlled interconnect device 13 is illustrated. Input terminal 10 is coupled through resistor R31 to a first terminal of resistor R32 and to a first input terminal of transformer T31 and through resistor R33 to terminal 20 and to a second input terminal of transformer T31. The second terminal of resistor R32 is coupled to the ground potential. A first output terminal of transformer T31 is coupled to the common potential, while the second output terminal of transformer T31 is coupled through resistor R34 to the common potential and to an input terminal of amplifier A41. The power terminal of amplifier A41 is coupled through capacitor C51 to the ground potential and through resistor R41 to the power source $V_{CC}$. The power source $V_{CC}$ is coupled through capacitor C52 to the ground potential, to a first terminal of variable resistor R43 and to the power terminal of amplifier A43. The output terminal of amplifier A41 is coupled to a first terminal of capacitor C53. A second terminal of capacitor C53 is coupled through resistor R57 to the ground potential, through variable capacitor C56 to an anode terminal of diode D41, through resistor R42 to a second terminal of variable resistor R43 and to a first input terminal of amplifier A43. A first output terminal of amplifier A43 is coupled to output terminal 15'' and to a first terminal of resistor R47. A second terminal of resistor R47 is coupled to a set terminal of amplifier A43, to the set terminal of amplifier A42, through inductor L41 to power source $V_{EE}$, through capacitor C54 to the common potential, through resistor R46 to the second output terminal of amplifier A43, through resistor R52 to output terminal 15' and a first output terminal of amplifier A42, and through resistor R53 to a second output terminal of amplifier A42. A second input terminal of amplifier A43 is coupled through resistor R44 to the ground potential and through resistor R45 to the second output terminal of amplifier A43. The cathode terminal of diode D41 is coupled through resistor R48 to the common potential, through capacitor C50 to the common potential and to a first input terminal of a first input terminal of amplifier A42. A second input terminal of amplifier A42 is coupled through resistor R49 to the common potential and through resistor R51 to the second output terminal of amplifier A42. The ground terminals of amplifiers A43 and A42 are coupled to the common potential. The power source $V_{EE}$ is coupled to the ground potential through C55. The power source $V_{CC}$ is coupled to the power terminal of amplifier A42. In the preferred embodiment, amplifier A41 is an NE5205 amplifier having an 18 db gain. Amplifiers A43 and A42 are implemented by PMI-08 High Speed ECL Voltage Comparators. The power source $V_{CC}$ has a capacitor inductor filtering system for isolation (not shown).

Figure 6:
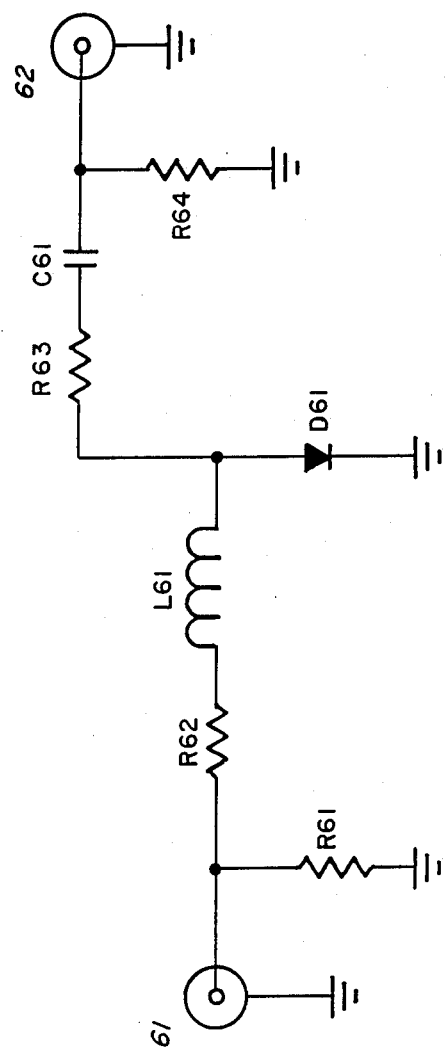
FIG. 6 is a schematic diagram of apparatus providing a controllable rapid change in impedance.

Referring next to FIG. 6, the apparatus for providing a controllable rapid impedance change to test the testing apparatus is illustrated. Terminal 61 is coupled through R61 to a ground potential and through resistor R62 to a first terminal of inductor L61. A second terminal of inductor L61 is coupled to an anode terminal of diode 61 and through resistor R63 to a first terminal of capacitor C61. A second terminal of capacitor C61 is coupled through resistor R64 to the common potential and to terminal 62. The cathode terminal of diode D61 is coupled to the ground potential.

2. Operation of the Preferred Embodiment

Referring to FIG. 1, FIG. 2, and FIG. 3, the detector unit 12 is implemented as a bridge configuration including resistors R31, R32 and R33 as three of the four bridge sections. The fourth section includes the interconnect device with the appropriate termination resistance RT. The transformer T31 is coupled between intermediate points of the bridge and a signal is introduced across the bridge via terminal 10. The resistor R34 provides a termination impedance across the secondary winding of the transformer RT. Typically, the termination impedance R34 and resistors R31 and R32 are 50 Ohms while the resistor R33 is equal to the impedance of the connector device under test, i.e., typically between 50 and 90 Ohms. As long as the impedances of the bridge arms maintain the same ratio and as long as phase shifts are not introduced, then no voltage difference is developed across the input transformer terminals and no signal will be developed across the secondary terminals of the transformer. The signal developed across the secondary winding of the transformer T31 is applied to amplifier A31. The output signal of amplifier A31 is applied through capacitor C33 and diode D31, providing a rectified signal. Capacitors C34 and C35 and resistors R37 and R38 provide a low frequency pass band filter for the rectified voltage from capacitor C34. The filtered signal originating from diode D31 is applied to the non-inverting terminal of operational amplifier A32. The operational amplifier A32 has a feedback circuit including diode D32, a diode that is matched to diode D31. The matched diode D32 compensates for the forward voltage drop across diode D31. Resistor R40 has a value roughly 20% of R37 and provides a flat response for signals from the detector unit 12 for output voltages from diode D31 of 40 millivolts. Resistor R39 and capacitor C36 form a filter attenuating oscillations from the output terminal of amplifier A32. The output voltage at terminal 15 is proportional to the deviation of the impedance of the connector under test, coupled to terminal 20 from the steady value. This circuit can remain coupled to the connector under test for extended periods of time to determine, for example, long term deviations under extreme environmental conditions.

Referring next to FIG. 4 and FIG. 5, the apparatus for measuring rapid intermittent changes in the impedance in a interconnect device according to the present invention is illustrated. Resistors 31 and 32 form one arm of a bridge circuit while resistor 33 and the interconnect device, coupled to terminal 20 form the second arm, as in FIG. 3. Across the arms of the bridge (i.e., detector) circuit, a signal having a frequency of 2 MHz to 100 MHz is applied via terminal 10. In the preferred embodiment, the signal is provided by a crystal controlled oscillator. The controlled impedance line has the same impedance as the interconnect device, the interconnect device being terminated with the characteristic impedance (typically between 50 and 90 Ohms). The transformer T31 is coupled between intermediate positions of the two bridge arms. Resistor 31, 32, and 33 are chosen in conjunction with the impedance presented by terminal 20 so that the voltage across the input windings of transformer T31 is zero, resulting in no voltage being applied to the secondary winding of transformer T31. However, when the impedance of the interconnect device changes, an imbalance results and a voltage is produced by the secondary winding of transformer T31. The secondary winding of the transformer T31 is coupled to a resistor R34, R34 being chosen to provide a characteristic impedance termination for transformer T31. The signal provided by the secondary winding of transformer T31 is amplified in amplifier circuit A41. The output signal from amplifier A41 is coupled via capacitor C53 to the non-inverting terminal of voltage comparator A43. Resistor R57 provides the termination impedance for voltage comparator A41. The output signal of operational amplifier A43 applied to terminal 15" follows the output signal from amplifier A41 when the signal level is greater than the reference voltage level determined for the non-inverting terminal of voltage comparator A43 by resistors R43 and R42. Because the output signal of amplifier A41 is a sinusoidal wave, the voltage comparator A43 will switch states for the sinusoidal wave peaks, providing clock pulses which can be counted to determine the duration of an impedance-changing event. Feedback resistor R45 provides a feedback path from non-inverting output terminal of voltage comparator A43 and provides a (9 mV) hysteresis voltage component. Resistor R47 provides a pull-down resistor function. The signal from amplifier A41 is applied through variable capacitor C56 to diode D41. The rectified signal from diode D41 is filtered by resistor R48 and capacitor C57 and applied to a non-inverting input terminal of voltage comparator A42. The values of resistor R48 and capacitor C57 are determined by the frequency of the signal applied to terminal 10. The output signal of the voltage comparator A42 is applied to terminal 15'. This output signal will change state when the input voltage is greater than approximately 10 mV in the preferred embodiment, the exact value being determined by resistors R51 and R49. Resistors R53 and R52 serve the resistor pull-down function. Thus, an event signal is applied to terminal 15' while a clock signal is applied to terminal 15". When an oscillator frequency of 100 MHz is employed, an impedance altering event can be measured to 5 nanoseconds.

The event signals from terminal 15' of FIG. 5 can be used to count the number of intermittent interconnect device impedance changes, i.e., in response to a selected mechanical environment. The clock signals from terminal 15" can measure the duration of the intermittent impedance changes.

In FIG. 3 and FIG. 5, resistors R31, R32, R33 and R34 as well as transformer T31 are placed in close physical proximity to enhance the high frequency response.

Referring next to FIG. 6, the apparatus for providing a rapid impedance fluctuation is shown. A pulse generator signal, approximately 12 volts in the preferred embodiment, is applied to terminal 61. The resistor R61 provides the proper termination for the apparatus generating the pulse. The terminal 62 receives the test frequency signal, approximately 100 MHz in the preferred embodiment. The pulse generator signal is applied through resistor R62 and inductor L61 to diode D61.

This signal causes diode D61 to become conducting, thereby placing resistor R63 in parallel with resistor R64. The capacitor C61 is selected to provide a low impedance to the test signal frequency. Resistor R62 limits the current to the diode, while inductor L61 prevents the high frequency test signal from being applied to the pulse generator (i.e., terminal 61). The change in impedance, as seen from terminal 62, resulting from activation of the diode D61 is determined by the value of resistor R63 and the capacitor C61. In the preferred embodiment, impedance changes of as little as 3 Ohms have been produced in less than 5 ns (nanoseconds). The apparatus can be coupled across the terminating impedance to test the operation of the testing apparatus shown in FIG. 4 and FIG. 5.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. Apparatus for testing long term and intermittent impedance changes in an interconnect device used to couple data processing system components, said apparatus comprising:
   a bridge circuit means for receiving a radio frequency input signal, an interconnect device being coupled in one arm of said bridge circuit by means of a cable, said interconnect device having a coupled impedance coupled thereto, said coupled impedance and said interconnect device impedance being generally equal to a characteristic impedance of said cable coupling said interconnect device to said bridge circuit means, said bridge circuit means providing an output signal in response to said radio frequency input signal when a value of said interconnect device impedance in said bridge circuit means changes;
   first signal processing means responsive to said output signal for providing a DC signal proportional to slow changes in said interconnect device impedance; and
   second signal processing means responsive to said output signal for providing a count signal in response to intermittent changes in said interconnect device impedance.

2. The apparatus for testing an impedance of an interconnect device of claim 1 wherein said bridge circuit means further includes three resistive elements and a transformer, said input signal being applied to first terminals of said three resistive elements and said interconnect device cable, a primary winding of said transformer being coupled to second terminals of said three resistive elements and said interconnect device cable, said output signal being provided by secondary windings of said transformer.

3. The apparatus for testing an impedance of an interconnect device of claim 2 further comprising
   a terminating impedance coupled across said transformer secondary windings.

4. The apparatus for testing an impedance of an interconnect device of claim 2 wherein said three resistive elements, said one arm, and said transformer are mutually positioned to enhance high frequency response.

5. The apparatus for testing an impedance of an interconnect device of claim 3 wherein said second signal processing means includes amplifying means for amplifying said bridge circuit output signal.

6. The apparatus for testing an impedance of an interconnect device of claim 5 wherein said second signal processing means for determining temporary change parameters includes:
   a first voltage comparator responsive to an output voltage from said amplifying means, said first voltage comparator providing clock signals having a frequency determined by said radio frequency input signal when an intermittent interconnect device impedance change is greater than a predetermined value; and
   a second voltage comparator responsive to said output signal from said amplifying means, said second voltage comparator having a first output signal state when said interconnect device impedance change is greater than said predetermined value, said clock signals permitting an interconnect impedance change greater than said predetermined value to be timed.

7. The apparatus for testing an impedance of an interconnect device of claim 6 further including impedance means coupled to said coupled impedance for controllably altering an impedance in said one arm of said bridge circuit means including said interconnect device.

8. The apparatus for testing an impedance of an interconnect device of claim 7 wherein said impedance means includes a diode coupled in series with said coupled impedance, wherein said impedance of said one arm of said bridge circuit means is altered when said diode is changed from a conducting to a non-conducting state.

9. The apparatus for testing an impedance of an interconnect device of claim 5 wherein said first signal processing means for providing a DC signal includes:
   a filter unit for rectifying and filtering said amplifying means output signal; and
   an operational amplifier for providing said DC signal in response to said rectified and filtered signal.

10. The apparatus for testing an impedance of an interconnect device of claim 9 wherein said first signal processing means further includes a first and a second diode, said first diode rectifying said amplifying means output signal, said second diode in an output circuit of said operational amplifier compensating for a voltage drop across said first diode.

11. The method of testing an impedance of an interconnect device used to couple data processing system components, said method comprising the steps of:
    coupling said interconnect device to a first end of a cable;
    coupling a coupled impedance to said interconnect device, said coupled impedance and an interconnect device having a characteristic impedance of said cable;
    coupling a second end of said cable in one arm of said bridge circuit, impedances of remaining arms of said bridge circuit being chosen to balance an impedance associated with said one arm;
    applying a radio frequency signal across said bridge circuit;
    detecting an imbalance signal when said bridge circuit is not balanced because of an intermittent change in impedance in said one arm when said change is greater than a preselected value; and
    processing said imbalance signal to provide a state signal during said intermittent change in impedance and to provide a clock signal with a frequency determined by said radio frequency signal.

12. The method of testing an impedance of an interconnect device of claim 11 wherein said processing step includes the steps of:
   using said state signals to determine a number of intermittent signals having a number of said intermittent changes; and
   using said clock signals to determine a duration of a one of said intermittent changes.

13. The method of testing an impedance of an interconnect device of claim 12 further comprising the step of calibrating said method of testing by a controllable intermittent impedance change in said one arm.

14. The method of testing an impedance of an interconnect device of claim 11 wherein said processing step includes generating a continuous output signal that is proportional to a long term change of an impedance of said interconnect device.

15. The method of testing an impedance of an interconnect device of claim 14 wherein said generating step includes generating said continuous output signal over an extended period of time.

16. The method of testing an impedance of an interconnect device of claim 15 wherein said generating step includes a step of generating said continuous output signal while said interconnect device is being subjected to preselected environments.

17. Test apparatus for testing intermittent and long term changes in an impedance of an interconnect device used in coupling data processing system components, said test apparatus comprising:
   bridge means with terminals for receiving a radio frequency signal, wherein said interconnect device is coupled to a first arm of said bridge means by means of a cable, wherein said interconnect device has a first impedance coupled thereto, said first impedance and an interconnect impedance providing a characteristic impedance for said cable, said bridge means for providing an imbalance signal when an impedance of said first arm changes from an initial value and said radio frequency signal is applied to said bridge means;
   amplifier means for receiving said imbalance signal and for providing a first output signal during a period when an intermittent first arm impedance change exceeds a preselected value, said amplifier means providing a clock signal having a frequency determined by said radio frequency signal during said period.

18. The test apparatus for testing an impedance of an interconnect device of claim 17 wherein said amplifier means provides a second output signal when a generally steady state change in said impedance exceeds a preestablished amount, said second output signal being proportional to an interconnect device impedance change, said amplifier means including:
   a first amplifier for receiving said imbalance signal;
   a first diode coupled to an output terminal of said first amplifier:
   a second amplifier for receiving a rectified output signal from said first diode and a first input terminal; and
   a second diode coupled between an output terminal of said second amplifier and a second input terminal of said second amplifier.

19. The test apparatus for testing an impedance of an interconnect device of claim 17 wherein said amplifier means includes:
   amplifier means responsive to said imbalance for providing an intermediate signal having low frequency signal components minimized;
   event detection means responsive to said intermediate signal for providing said first output signal during said period when said first arm intermittent impedance change exceeds said preselected value; and
   clock means responsive to said intermediate signal for providing said clock signal during said period.

20. The test apparatus for testing an impedance of an interconnect device of claim 19 wherein said radio frequency signal has frequency of 2 MHz to 100 MHz.

21. The test apparatus for testing an impedance of an interconnect device of claim 20, wherein said interconnect device impedance change is intermittent, said 100 MHz radio frequency signal permitting measurement of an interconnect impedance change lasting 5 nanoseconds.

22. The test apparatus for testing an impedance of an interconnect device of claim 19 further comprising test means for generating a controllable intermittent impedance change in said first arm for testing said amplifier means.

23. The test apparatus for testing an impedance of and interconnect device of claim 22 wherein said test means provides an intermittent controllable change in said first arm impedance by controlling a bias voltage across a diode.

* * * * *